United States Patent
Sakai et al.

(10) Patent No.: US 8,350,160 B2
(45) Date of Patent: Jan. 8, 2013

(54) STRUCTURE, ELECTRONIC DEVICE, AND METHOD FOR FABRICATING A STRUCTURE

(75) Inventors: Tadashi Sakai, Yokohama (JP); Naoshi Sakuma, Yokohama (JP); Masayuki Katagiri, Kawasaki (JP); Mariko Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 13/060,994

(22) PCT Filed: Aug. 25, 2008

(86) PCT No.: PCT/JP2008/065128
§ 371 (c)(1),
(2), (4) Date: Feb. 25, 2011

(87) PCT Pub. No.: WO2010/023720
PCT Pub. Date: Mar. 4, 2010

(65) Prior Publication Data
US 2011/0147177 A1 Jun. 23, 2011

(51) Int. Cl.
*H05K 1/09* (2006.01)
(52) U.S. Cl. ........ 174/257; 174/255; 174/261; 977/742; 977/743; 977/932; 977/842
(58) Field of Classification Search .................. 174/255, 174/257, 261; 977/742, 932, 743, 745, 842, 977/876
See application file for complete search history.

(56) References Cited

U.S. PATENT DOCUMENTS

| | | | |
|---|---|---|---|
| 6,232,706 B1 * | 5/2001 | Dai et al. | 313/309 |
| 6,297,063 B1 * | 10/2001 | Brown et al. | 438/2 |
| 7,135,773 B2 * | 11/2006 | Furukawa et al. | 257/758 |
| 8,048,688 B2 * | 11/2011 | Suhir et al. | 438/14 |
| 2005/0285116 A1 * | 12/2005 | Wang | 257/76 |
| 2008/0211101 A1 * | 9/2008 | Han et al. | 257/752 |
| 2009/0102046 A1 * | 4/2009 | Dimitrakopoulos et al. | 257/712 |

FOREIGN PATENT DOCUMENTS

| | | |
|---|---|---|
| JP | 2002 329723 | 11/2002 |
| JP | 2007 115798 | 5/2007 |
| JP | 2007 279014 | 10/2007 |
| JP | 2008 137846 | 6/2008 |
| JP | 2008 210954 | 9/2008 |

OTHER PUBLICATIONS

International Search Report issued Oct. 7, 2008 in PCT/JP08/65128 filed Aug. 25, 2008.
Iwai, T. et al., "Thermal and Source Bumps utilizing Carbon Nanotubes for Flip-chip High Power Amplifiers", International Electronic Device Meeting (IDEM), IEEE Cat., No. 05CH37703C, (Total 4 pages), (2005).

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A structure includes a conductive film (12) provided in an underlying layer (10); and a carbon nanotube bundle (20) including a plurality of carbon nanotubes each having one end connected to the conductive film (12), wherein, at other end side of the carbon nanotube bundle (20), at least carbon nanotubes allocated at outer side of the carbon nanotube bundle (20) extend with convex curvatures toward the outside of the carbon nanotube bundle (20), and the convex curvatures of the carbon nanotubes allocated at the outer side of the carbon nanotube bundle are larger than those of inner side of the carbon nanotube bundle (20), and diameters of the carbon nanotube bundle (20) decrease toward the other end of the carbon nanotube bundle (20).

9 Claims, 13 Drawing Sheets

STRUCTURE, ELECTRONIC DEVICE, AND METHOD FOR FABRICATING A STRUCTURE

TECHNICAL FIELD

The present invention relates to a structure using carbon nanotubes, an electronic device and a method for fabricating a structure.

BACKGROUND ART

A carbon nanotube (hereinafter referred as "CNT") has a high electric conduction characteristic, a high thermal conduction characteristic, and high mechanical strength. Thus, the CNT has been drawing attention as a material for wiring, an electrode, a contact, and the like to replace a metal. For example, in order to conduct a practical amount of current or heat, there has been a proposal to combine a plurality of CNTs into a bundle (hereinafter referred as "CNT bundle") to use in a contact electrode, such as a pad and a bump of a semiconductor device, instead of using the CNT one by one (refer to JP-A 2007-115798 (KOKAI) and Iwai et al., International Electronic Device Meeting (IEDM), IEEE Cat. No. 05CH37703C (USA) CD-ROM pp. 4-7, 2005).

However, the following problems arise when the CNTs are used as a wider connecting terminal, electrode or the like. Specifically, although the CNT itself has high strength, the CNTs in the CNT bundle are gathered only by the van der Waals force. For this reason, scattering of the CNT bundle itself is apt to occur. For example, in case of a contact electrode, there is a concern that outward spreading or buckling of the CNTs may occur when a normal pressure is applied to the contact electrode. Moreover, by outward spreading or buckling of the CNTs, there is a possibility of being into contact with an adjacent structure using the CNTs, and preventing a narrower pitch of the structures.

DISCLOSURE OF THE INVENTION

An object of the present invention is to provide a structure capable of preventing scattering of CNTs, an electronic device, and a method for fabricating a structure.

A first aspect of the present invention inheres in a structure including a conductive film provided in an underlying layer; and a carbon nanotube bundle including a plurality of carbon nanotubes each having one end connected to the conductive film, wherein, at other end side of the carbon nanotube bundle, at least carbon nanotubes allocated at outer side of the carbon nanotube bundle extend with convex curvatures toward the outside of the carbon nanotube bundle, and the convex curvatures of the carbon nanotubes allocated at the outer side of the carbon nanotube bundle are larger than those of inner side of the carbon nanotube bundle, and diameters of the carbon nanotube bundle decrease toward the other end of the carbon nanotube bundle.

A second aspect of the present invention inheres in an electronic device including a first substrate including a contact electrode of a first carbon nanotube bundle including a plurality of first carbon nanotubes each having one end connected to first wiring provided on a underlying layer, wherein, at other end side of the first carbon nanotube bundle, at least first carbon nanotubes allocated at outer side of the first carbon nanotube bundle extend with convex curvatures toward the outside of the first carbon nanotube bundle, the convex curvatures of the first carbon nanotubes allocated at outer side of the first carbon nanotube bundle are larger than those of inner side of the first carbon nanotube bundle, and diameters of the first carbon nanotube bundle decrease toward the other end of the first carbon nanotube bundle; and a second substrate facing the first substrate, the second substrate including second wiring electrically connected to the contact electrode.

A third aspect of the present invention inheres in a method for fabricating a structure by growing a carbon nanotube bundle in a reaction chamber generating a plasma, the carbon nanotube bundle including a plurality of carbon nanotubes each having one end connected to a conductive film provided on a underlying layer, the method including growing a first portion of the carbon nanotubes on the conductive film by setting a growth temperature, concentration of a hydrocarbon gas supplied to the reaction chamber, and grid potential of a grid provided between the plasma and the conductive film so that, at other end side of the carbon nanotube bundle, at least carbon nanotubes allocated at outer side of the carbon nanotube bundle extend with convex curvatures to the outside of the carbon nanotube bundle, the convex curvatures of the carbon nanotubes allocated at the outer side of the carbon nanotube bundle are larger than those of inner side of the carbon nanotube bundle, and diameters of the carbon nanotube bundle decrease toward the other end of the carbon nanotube bundle; and growing a second portion of the carbon nanotubes by executing at least any one of lowering the growth temperature, increasing the concentration of the hydrocarbon gas, and reducing the grid potential so that each of the carbon nanotubes has a meandering shape between the conductive film and the first portion.

BEST MODES FOR CARRYING OUT THE INVENTION

Figure 1:
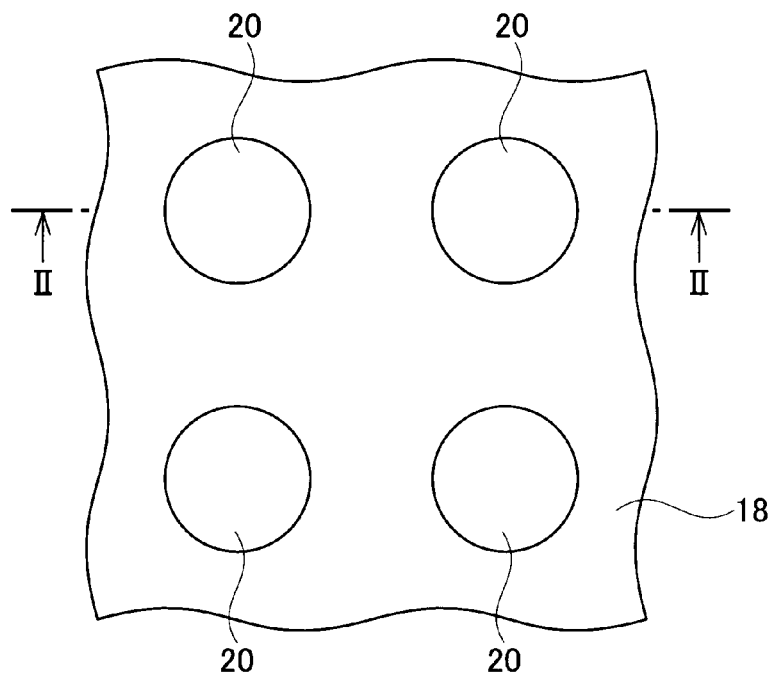
FIG. 1 is a schematic plan view showing an example of a structure according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
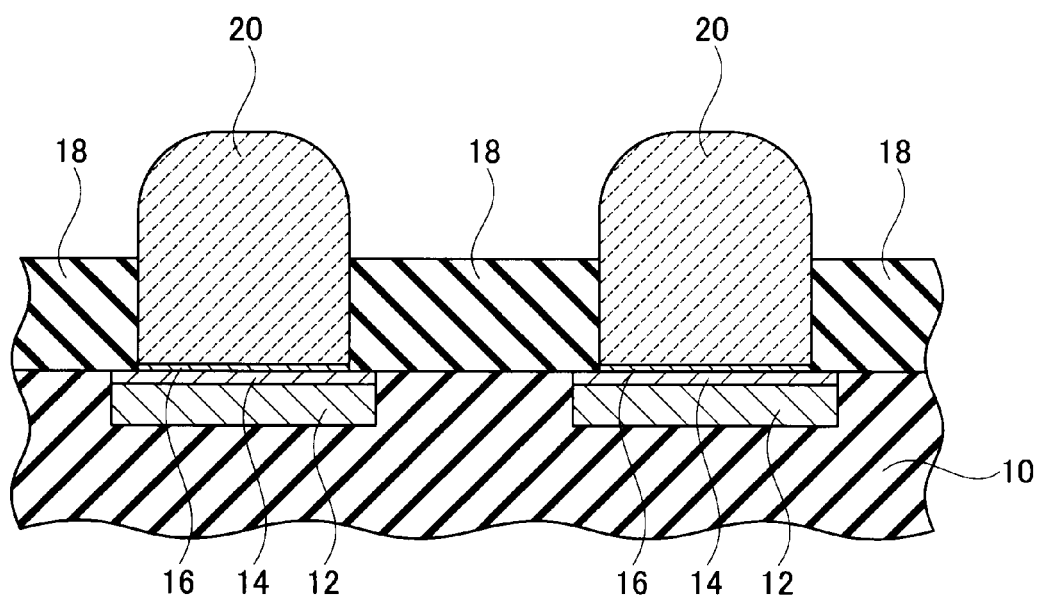
FIG. 2 is a cross sectional view taken along line II-II of the structure shown in FIG. 1.

As shown in FIGS. 1 and 2, a structure according to an embodiment of the present invention includes a plurality of conductive films (12 and 14) provided in an underlying layer 10, and a plurality of bundles of CNT (CNT bundles) 20 each having an end connected to each of the plurality of conductive films (12 and 14). Each of the plurality of CNT bundles 20 is disposed in each through hole provided in an insulating film 18 on the underlying layer 10. A catalyst layer 16 is disposed between each of the conductive films (12 and 14) and each of the CNT bundles 20. Each of the conductive films (12 and 14) includes first and second conductive films 12 and 14.

For example, the CNT bundles 20 are used for contact electrodes, such as bumps, of an electronic device such as a semiconductor device. The conductive films (12 and 14) are used as a wiring connected to a semiconductor circuit or the like that is formed on a semiconductor substrate. The underlying layer 10 is a wiring layer provided on the semiconductor substrate.

Figure 3:
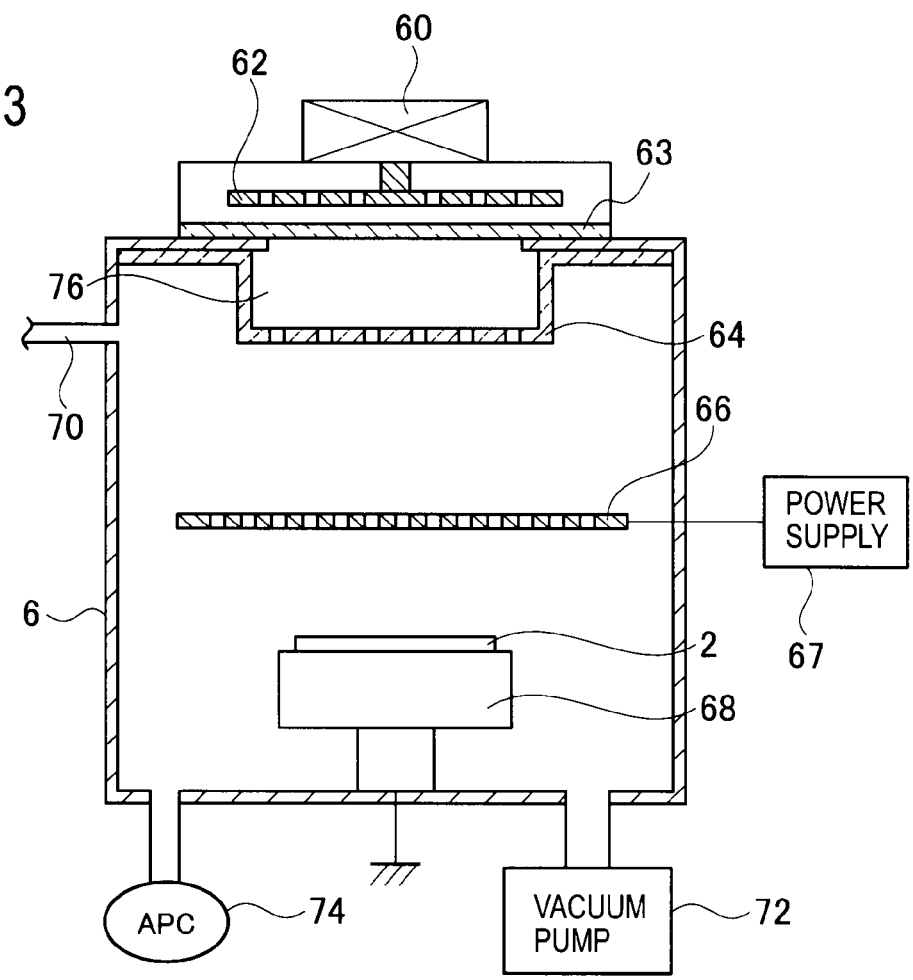
FIG. 3 is a schematic view showing an example of an apparatus used for growth of CNT according to the embodiment of the present invention.

It is desirable to use a plasma chemical vapor deposition (CVD) method for forming the CNT bundles 20. FIG. 3 shows a surface wave plasma CVD apparatus as an example. Microwave introduced from a microwave waveguide 60 is fed into a reaction chamber 6 from a quartz window 63 through a slit antenna 62. Plasma is generated by discharging in the reaction chamber 6 by the fed microwave. An ion trap 64 made of silica glass or the like is disposed for retaining the plasma in a discharge region 76 in the vicinity of the slit antenna 62 of the reaction chamber 6 and so as to reduce ion components. A feed gas is introduced from a gas introduction port 70 into the reaction chamber 6. The inside of the reaction chamber 6 is evacuated by a vacuum pump 72 and is maintained at a predetermined pressure by a flow rate of the feed gas and an automatic pressure controller (APC) 74. A substrate 2 is disposed on a susceptor 68 having an embedded heater and is maintained at a predetermined growth temperature. A grid 66 is disposed between the discharge region 76 and the substrate 2. A power supply 67 applies a grid potential to the grid 66 so as to suppress charge components which diffuse from the discharge region 76 onto the substrate 2.

A hydrocarbon gas, such as methane ($CH_4$) and acetylene ($C_2H_2$), and a diluent gas, such as hydrogen ($H_2$), argon (Ar), helium (He), and nitrogen ($N_2$), are used as the feed gas. It is also possible to use only the hydrocarbon gas without the dilution gas depending on the growth condition.

Figure 4:
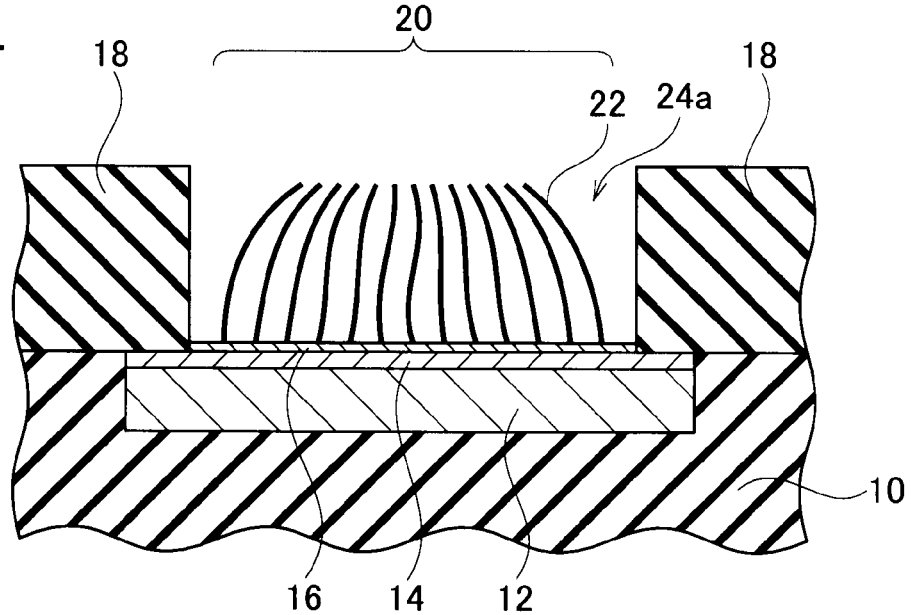
FIGS. 4 and 5 are schematic cross sectional views showing an example of a method for fabricating a CNT bundle according to the embodiment of the present invention.

As shown in FIG. 4, the first and second conductive films 12 and 14 are provided in the underlying layer 10 on the substrate 2. The insulating film 18 is formed on the underlying layer 10 and the though hole is formed on the insulating film 18 so as to expose a surface of the second conductive film 14. The catalyst layer 16 is formed on the surface of the second conductive film 14 by vaporizing catalytic metal by physical vapor deposition, such as laser abrasion.

The substrate 2 thus prepared is disposed on the susceptor 68 of the plasma CVD apparatus shown in FIG. 3 and is subjected to CNT growth. For example, the $CH_4$ gas and $H_2$ gas are used as the feed gas, and concentration of the $CH_4$ gas is approximately 10%. In addition, the grid potential is grounded. First, the growth temperature is in a range from about 600° C. to about 900° C., and desirably in a range from about 600° C. to about 700° C. As a result, a first portion 24a of the CNT bundle 20 including a plurality of CNTs 22 each of which has one end connected to the catalyst layer 16 on the second conductive film 14 is grown.

Each of the grown CNTs 22 converges toward the center of the CNT bundle 20 by the van der Waals force. Accordingly, among the CNTs 22, the CNTs 22, at least the carbon CNTs 22 allocated at the outer side of the CNT bundle 20 are grown so as to extend with convex curvatures toward the outside of the CNT bundle 20, and the curvatures of the CNTs 22 allocated at the outer side of the CNT bundle 20 are larger than those of the inner side of the CNT bundle 20. As a result, diameters of the CNT bundle 20 decrease toward the leading end of the CNT bundle 20. Moreover, since the feed gas is sufficiently supplied to the outside portion of the CNT bundle 20, a length of each of the CNTs 22 increases from the inside toward the outside of the CNT bundle 20.

Figure 5:
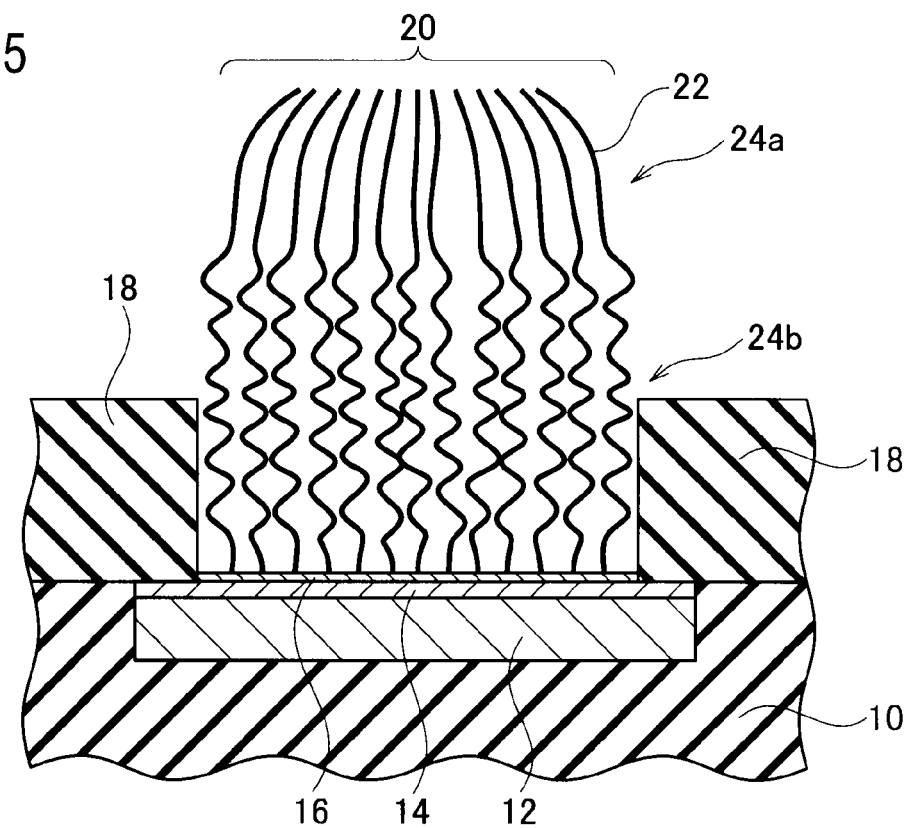

Thereafter, the growth temperature is reduced in a range from about 400° C. to about 600° C., and desirably in a range from about 400° C. to about 500° C. Growth of the CNTs 22 occurs at an interface between the CNTs 22 and the catalyst layer 16, and thereby a second portion 24b grows beneath the first portion 24a, as shown in FIG. 5. Since the growth temperature is reduced, the CNTs 22 having a meandering shape with less linearity grows. As a result, it is possible to suppress convergence of the CNTs 22 to the center portion by the van der Waals force, and to hold a substantially constant dimension of the outer diameter of the second portion 24b. In this way, the CNT bundle 20 having the first and second portions 24a and 24b is formed.

Figure 6:
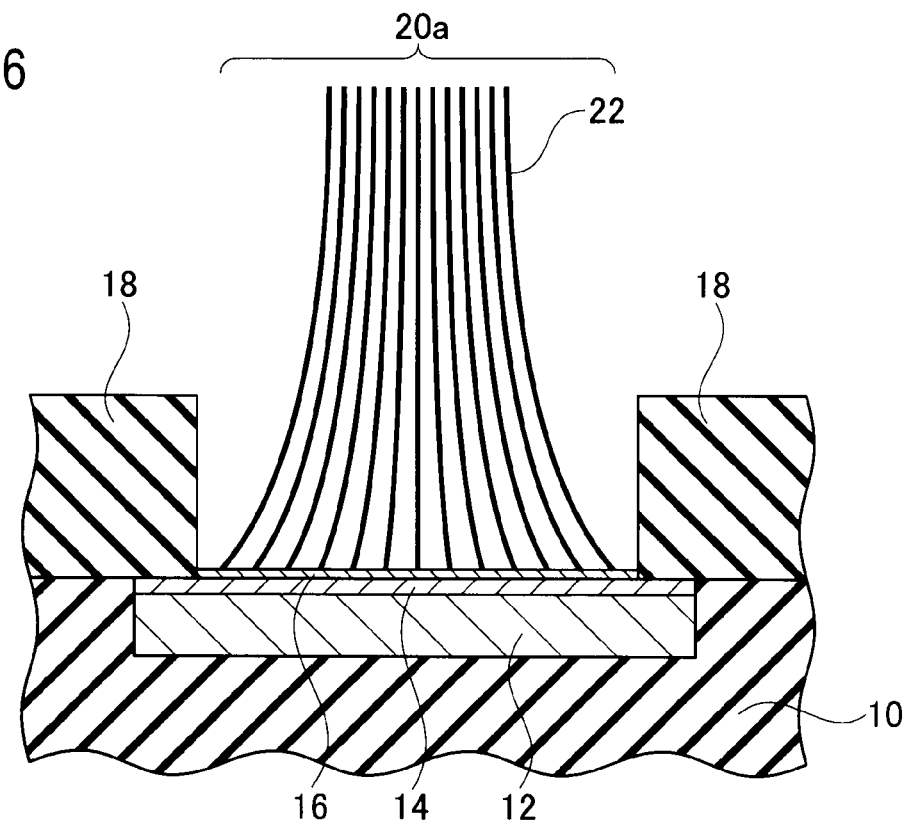
FIG. 6 is a schematic cross sectional view showing an example of a CNT bundle of a comparative example.

FIG. 6 shows a CNT bundle 20a when the CNTs 22 are grown without reducing the growth temperature, as a comparative example. As shown in FIG. 6, the CNTs 22 grow with higher linearity. As a result, each of the CNTs 22 grows so as to extend with a concave curvature toward the outside in a base end portion, and thereby the almost straight CNT bundle 20a having a smaller diameter in the leading end portion than the base end portion is formed.

In the CNT bundle 20a of the comparative example, each of the CNTs 22 is substantially straight in the leading end. Accordingly, scattering of the CNT bundle 20a occurs when a pressure is applied onto the leading end of the CNT bundle 20a. On the contrary, according to the embodiment of the present invention, in the leading end portion, the CNT bundle 20 has an enveloping surface shape having the convex curvature toward the outside of the CNT bundle 20 and including the CNTs 22 converging toward the center. Thus, scattering of the CNT bundle 20 itself hardly occurs.

The catalyst layer 16 functions as a catalytic metal for growing the CNT bundle 20. For the catalyst layer 16, metal particles of a metal, such as cobalt (Co), nickel (Ni) and iron (Fe), or an alloy mainly containing Co, Ni or Fe, may be used. A diameter of each CNT 22 in the CNT bundle 20 is controlled by adjusting an average particle diameter of the catalyst layer 16. Accordingly, the average particle diameter of the catalyst layer 16 is in a range from about 2 nm to about 10 nm, and desirably in a range from about 4 nm to about 6 nm. Here, the average particle diameter is defined as an average diameter when the metal particles are assumed to have a spherical shape. The particle diameter is measured, for example, by a laser diffraction scattering method and the like.

Moreover, for the first conductive layer 12, a metal, such as copper (Cu), aluminum (Al) and tungsten (W), may be used. For the second conductive layer 14, titanium nitride (TiN) and the like may be used. For the underlying layer 10 and the insulating film 18, a silicon oxide ($SiO_2$) film, a silicon nitride ($Si_3N_4$) film, a low-dielectric (low-k) insulating film, and the like may be used. For a material of the low-k insulating film, an inorganic material, such as carbon-doped silicon oxide (SiOC) and inorganic spin-on glass (SOG), and an organic material, such as organic SOG and the like, may be used. Alternatively, for a material of the low-k insulating film, a laminated film of an inorganic material film and an organic material film may be used.

Figure 7:
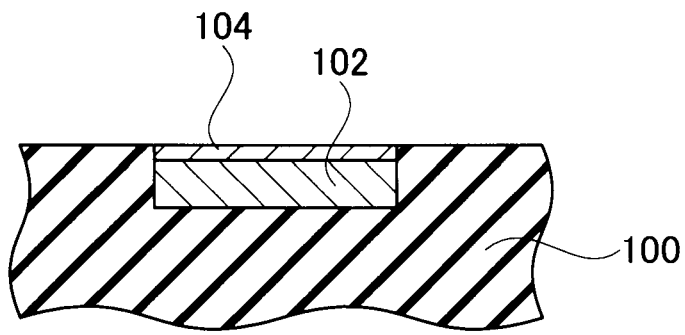
FIG. 7 is a schematic cross sectional view showing an example of a mounting substrate used for explanation of the embodiment of the present invention.
Figure 8:
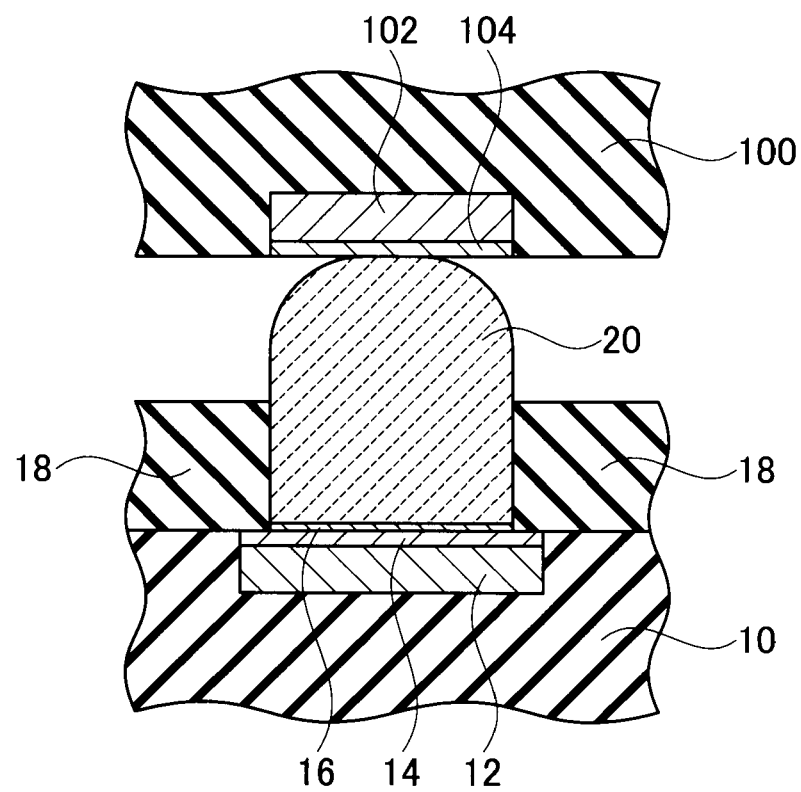
FIG. 8 is a schematic cross sectional view showing an example of connection between the structure according to the embodiment of the present invention and the mounting substrate.

For example, the structure according to the embodiment of the present invention is provided on the uppermost wiring (first wiring) on a first substrate having a semiconductor circuit formed thereon and is used as a contact electrode, such as a bump. As shown in FIG. 7, for a second wiring, a conductive film 102, such as Cu and the like, and a conductive film 104, such as TiN and the like, on the conductive film 102, are formed on a second substrate 100 which is used as a mounting substrate, such as a package and the like. As shown in FIG. 8, the conductive film 104 of the second wiring faces the CNT bundle 20 serving as a contact electrode so as to electrically connect to the CNT bundle 20.

In this case, the CNT bundle 20 is connected to the second wiring by applying a pressure to the CNT bundle 20. Since the CNT bundle 20 has a convex shape toward the outer periphery of the CNT bundle 20, it is possible to prevent the occurrence of outward spreading or buckling when the pressure is applied. Moreover, since the scattering of the CNT bundle 20 may not occur even by application of pressure, there is no possibility of being into contact with an adjacent structure. Accordingly, it is possible to achieve a narrower pitch between the contact electrodes.

Moreover, in the base end portion of the CNT bundle 20, each of the CNTs 22 has a structure having greater meandering shape as compared to the leading end portion. Accordingly, it is possible to achieve a contact by higher pressure. Furthermore, since the CNTs 22 have the meandering shapes as shown in FIG. 5, it is possible to achieve a reliable connection by an effect of spring action.

Note that, in the above description, the first and second portions 24a, 24b are grown by changing the growth temperature. However, it is possible to grow the first and second portions 24a, 24b by changing at least any one of the growth temperature, the concentration of the hydrocarbon gas, and the grid potential.

For example, the growth temperature is set to about 600° C. and the grid potential is grounded. The first portion 24a can be grown by setting the $CH_4$ gas concentration as low as in a range from about 1% to about 0.01%, and desirably in a range from about 1% to about 0.1%. The second portion 24b can be grown by increasing the $CH_4$ gas concentration in a range from about 10% to about 100%, and desirably in a range from about 10% to about 50%.

Alternatively, the growth temperature is set to about 600° C. and the $CH_4$ gas concentration is set to about 10%. The first portion 24a can be grown by setting the grid potential to a positive potential. The second portion 24b can be grown by decreasing the grid potential or changing the grid potential to a floating state.

Next, a method of manufacturing a semiconductor device applying the structure according to the embodiment of the present invention will be described with reference to process cross sectional views shown in FIGS. 9 to 13.

Figure 9:
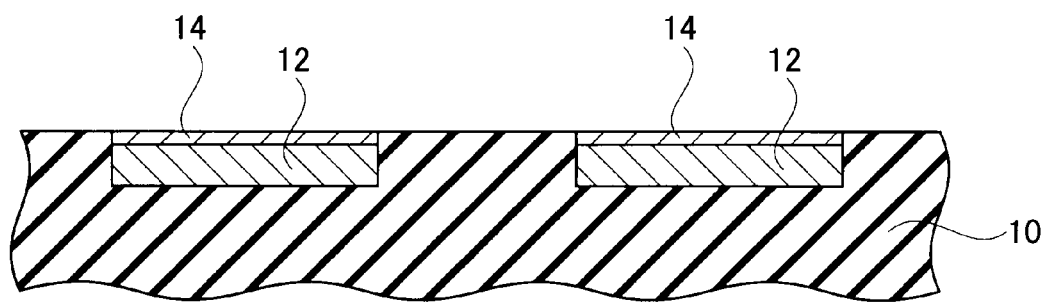
FIGS. 9 to 13 are cross sectional views showing an example of a method for manufacturing a semiconductor device using a structure according to the embodiment of the present invention.

As shown in FIG. 9, by photolithography, etching, sputtering, and the like, a first conductive film 12, such as Cu and the like, and a second conductive film 14, such as TiN and the like, are formed on a wiring layer (an underlying layer) 10 formed on a substrate in which a semiconductor circuit and the like is formed. The first and the second conductive films 12, 14 are used as a wiring.

Figure 10:
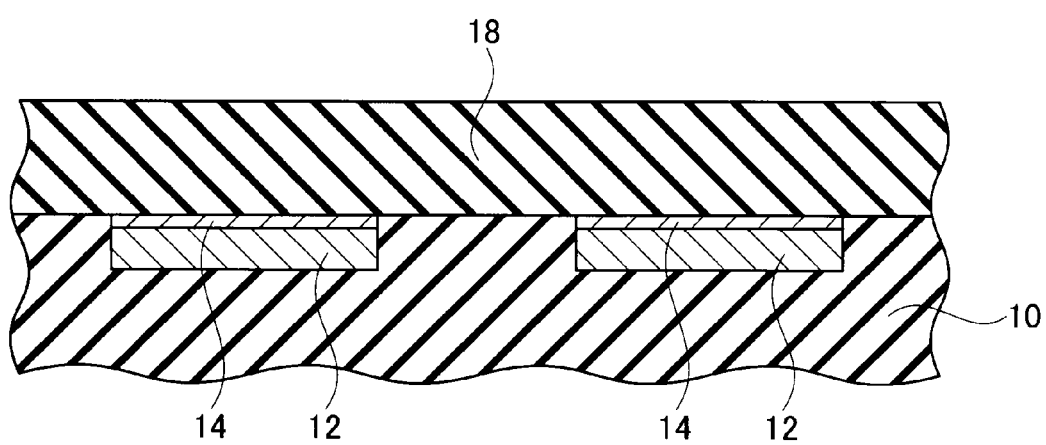

As shown in FIG. 10, an insulating film 18, such as $SiO_2$ and the like, is deposited on the wiring layer 10 by CVD and the like.

Figure 11:
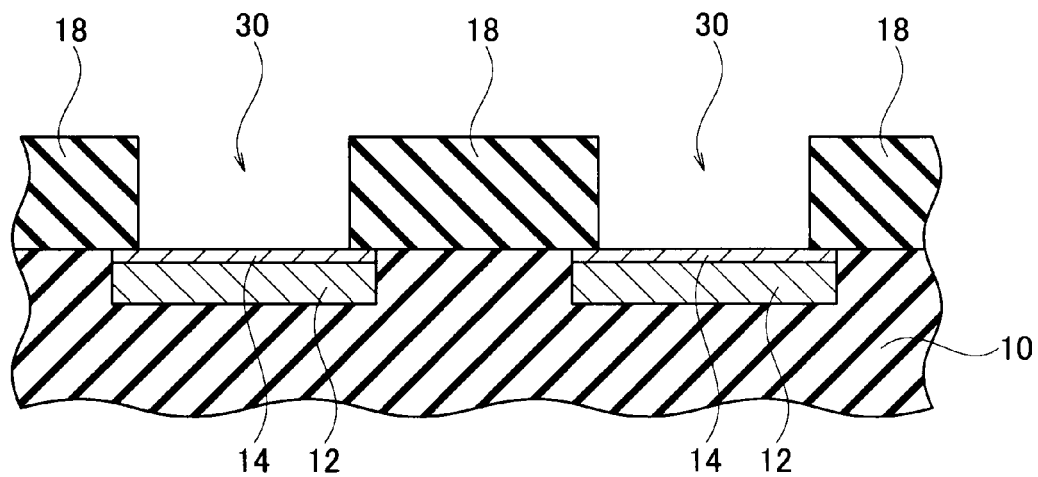

As shown in FIG. 11, through holes 30 are formed by selectively removing a part of the insulating film 18 by photolithography, etching, and the like. A surface of the second conductive film 14 is exposed in each of the through holes 30.

Figure 12:
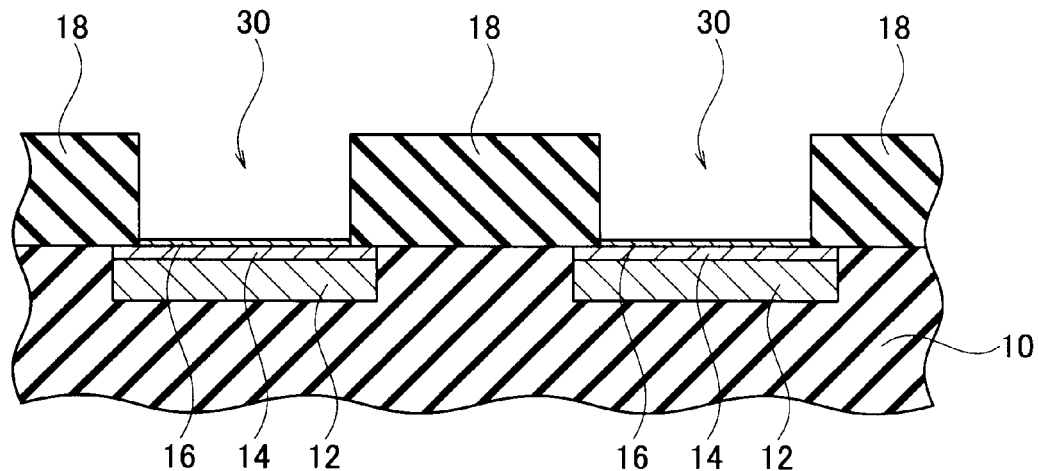

As shown in FIG. 12, catalyst layers 16, such as Co and the like, are formed on each surface of the second conductive film 14 exposed in the through holes 30 by physical vapor deposition and the like.

Figure 13:
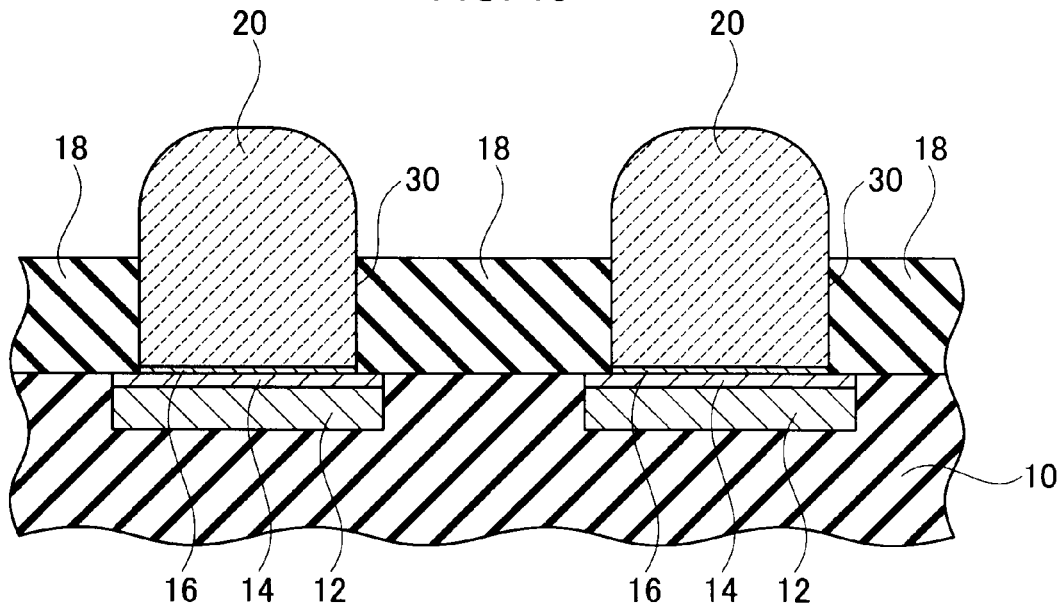

As shown in FIG. 13, CNT bundles 20 are grown on the respective catalyst layers 16 by plasma CVD using the plasma CVD apparatus shown in FIG. 3. First, CNT growth is performed under conditions of a growth temperature of about 600° C., a $CH_4$ concentration of about 10%, and a grid potential of grounding. Thereafter, another CNT growth is performed while decreasing the growth temperature to about 500° C. As a result, each of the CNT bundles 20 is formed so as to have a convex curvature toward the outer periphery in a leading end portion and to fill the corresponding through hole 30 in a base end portion.

In the embodiment of the present invention, a remote plasma is generated in the reaction chamber 6 by an introduction method of a surface wave type electromagnetic wave, as shown in FIG. 3. Accordingly, generation of an amorphous carbon or damage of the catalyst layer 16 by the plasma may be minimized. Additionally, ion components included in discharge activated species excited by a microwave power introduced from the surface wave type slit antenna 62 possibly generate amorphous carbon during the CNT growth. Accordingly, the ion components are reduced by providing the ion trap 64 in the vicinity of the microwave feeding portion and thereby retaining the discharged gas in the discharge region 76. Moreover, the grid 66 made of metal mesh is provided in the vicinity of the substrate 2 to neutralize the charge components that are diffused from the discharge region 76. In this way, it is possible to grow the CNT bundles selectively in the through holes 30.

Here, each diameter and each deposition surface density of the CNTs 22 are controlled by the underlying catalyst layer 16. For example, size distribution of clusters of Co or the like, evaporated by laser abrasion and the like, is adjusted by an impactor method and the like. In this way, the catalyst layer 16 is formed by depositing metal particles, such as Co and the like, having an average particle size of approximately 5 nm with a desired surface density. Alternatively, the catalyst layer 16 may be formed by heating and agglomerating a deposited thin metal film, such as Co and the like, at a predetermined temperature.

Figure 14:
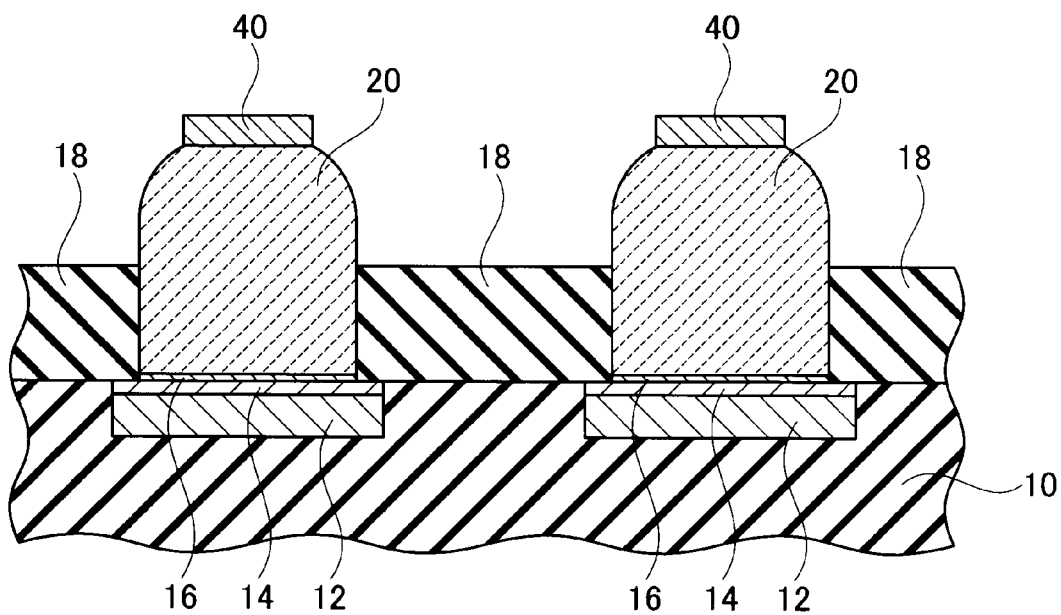
FIG. 14 is a schematic cross sectional view showing another example of a structure according to the embodiment of the present invention.

In addition, as shown in FIG. 14, a metal film 40 may be provided selectively on each leading end of the CNT bundles 20. It is possible to select any material other than carbon as a leading contact portion of the contact electrode. Moreover, it is effective to provide the metal film 40 when it is necessary to avoid a fine needle structure of each CNT 22. The metal film 40 can be formed by printing and transferring a preliminary formed paste electrode. Alternatively, the metal film 40 may be formed by vapor deposition using a mask.

Figure 15:
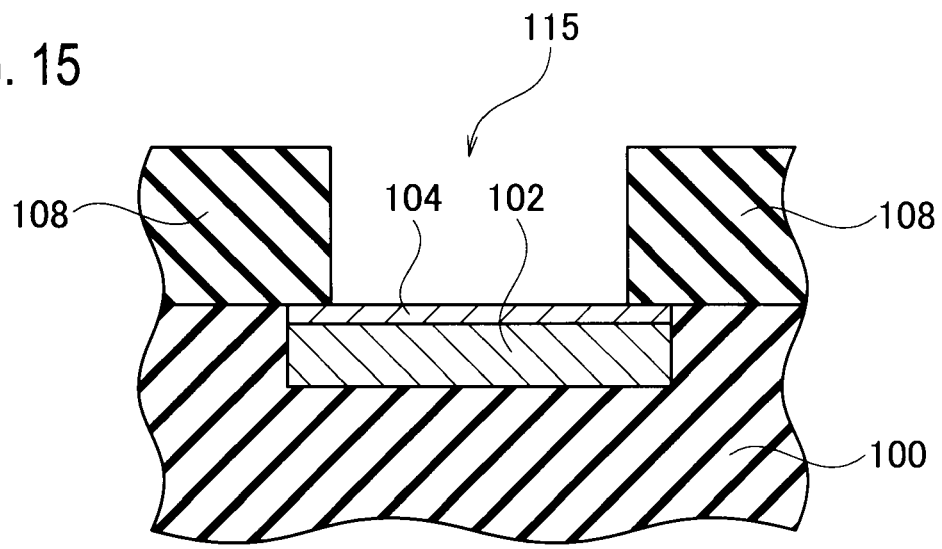
FIG. 15 is a schematic cross sectional view showing another example of a mounting substrate used for explanation of the embodiment of the present invention.

Further, when the structure according to the embodiment of the present invention is used for the contact electrode to connect with a wiring of a package or the like, it is also possible to provide a through hole 115 in an insulating film 108 formed on a substrate 100 of the package, as shown in FIG. 15. The dimension of the through hole 115 is adjusted to the outside diameter of the CNT bundle 20.

Figure 16:
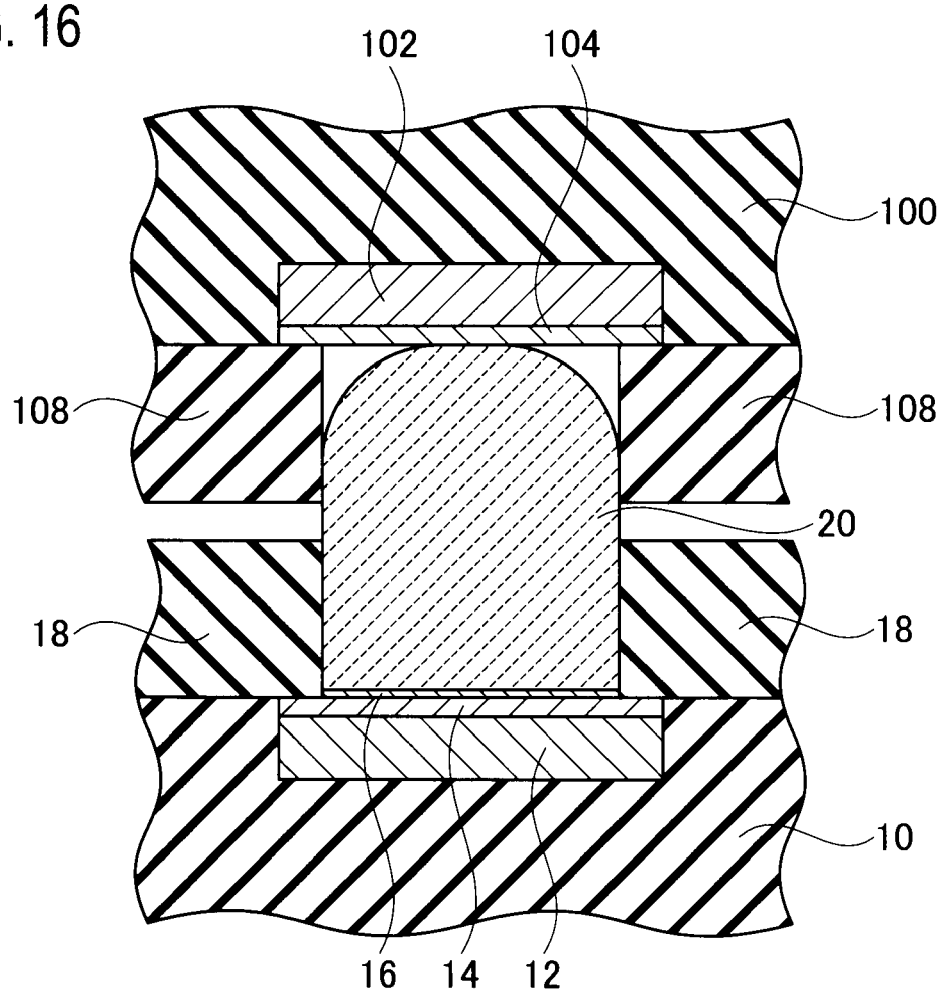
FIG. 16 is a schematic cross sectional view showing another example of connection between the structure according to the embodiment of the present invention and the mounting substrate.

As shown in FIG. 16, the CNT bundle 20 is connected to the conductive films 102 and 104 so as to fit the leading end portion of the CNT bundle 20 into the through hole 115. The leading end portion of the CNT bundle 20 has a smaller diameter. Accordingly, it is possible to smoothly execute positioning or fitting of the CNT bundle 20 with the conductive films 102 and 104. Moreover, there is no possibility of protrusion of the CNT bundle 20 from the through hole 115. Accordingly, it is possible to push the CNT bundle 20 with appropriate contact pressure and thereby to achieve a good contact between the CNT bundle 20 and the conductive film 104. In this way, it is possible to enhance electrical or thermal conduction.

Figure 17:
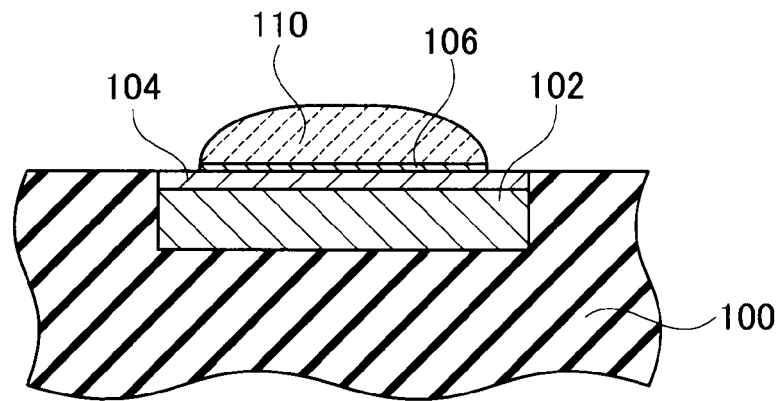
FIG. 17 is a schematic cross sectional view showing another example of the mounting substrate used for explanation of the embodiment of the present invention.
Figure 18:
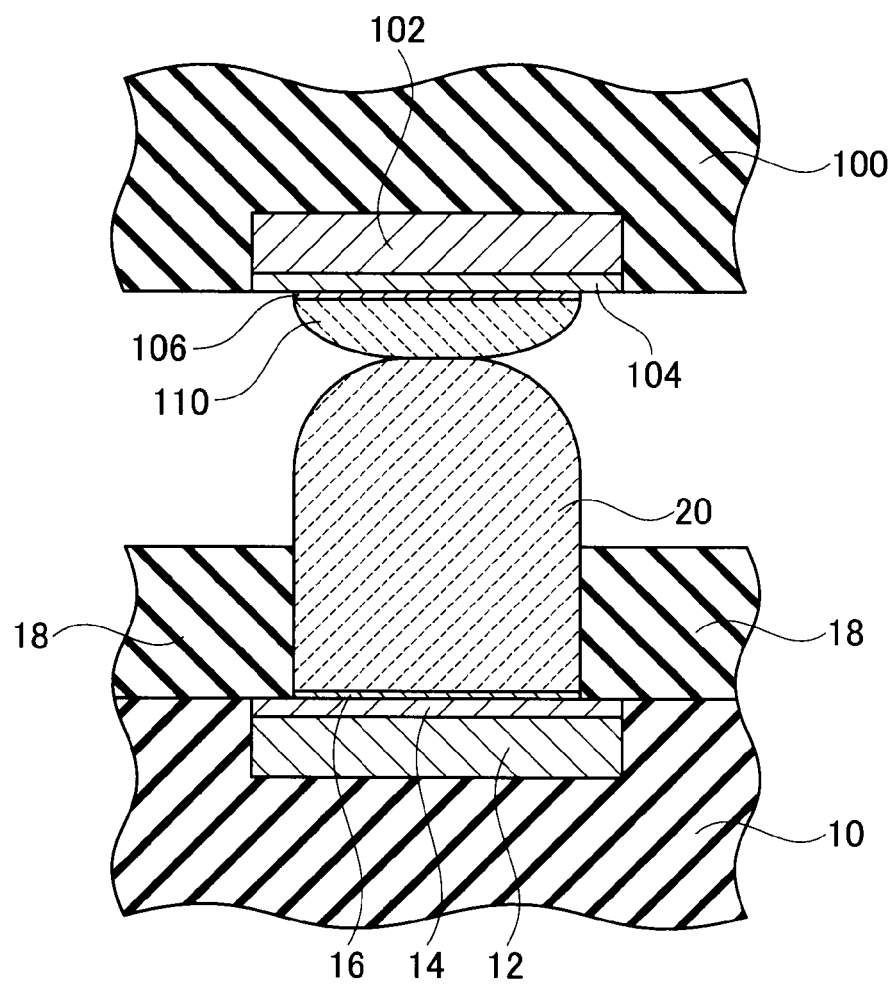
FIG. 18 is a schematic cross sectional view showing another example of connection between the structure according to the embodiment of the present invention and the mounting substrate.

Further, as shown in FIG. 17, a CNT bundle 110 may be formed on a surface of the conductive film 104. In this case, the CNT bundle 110 is grown on a catalyst layer 106 formed on the surface of the conductive film 104. As shown in FIG. 18, the CNT bundle 20 is connected to the CNT bundle 110 so as to push each other. The CNT bundle 110 may have only the first portion 24a shown in FIG. 4.

Figure 19:
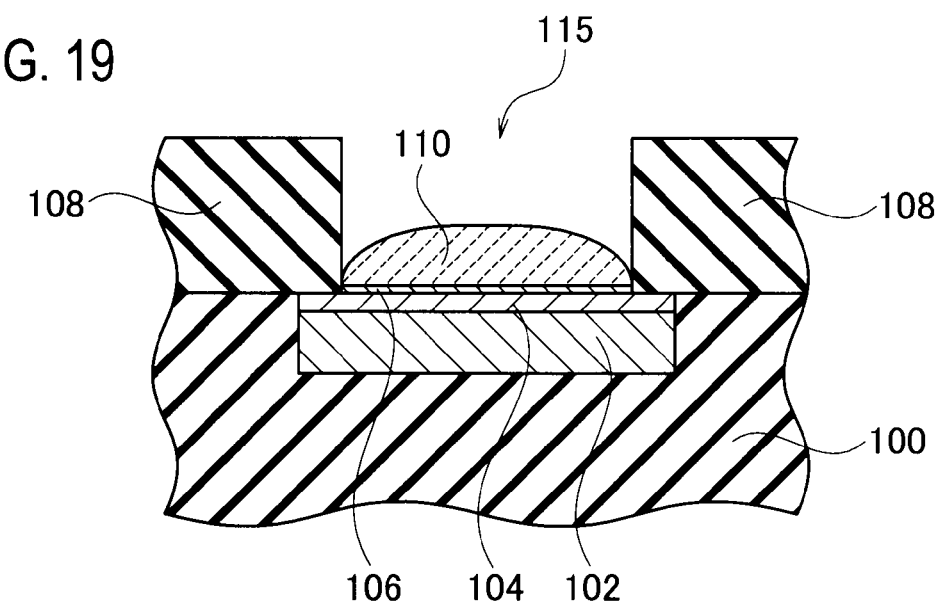
FIG. 19 is a schematic cross sectional view showing another example of the mounting substrate used for explanation of the embodiment of the present invention.

Furthermore, as shown in FIG. 19, the CNT bundle 110 may be formed in the through hole 115 provided in the insulating film 108. In this case, as shown in FIG. 20, the CNT bundle 20 is connected to the CNT bundle 110 so as to fit into the through hole 115.

Figure 20:
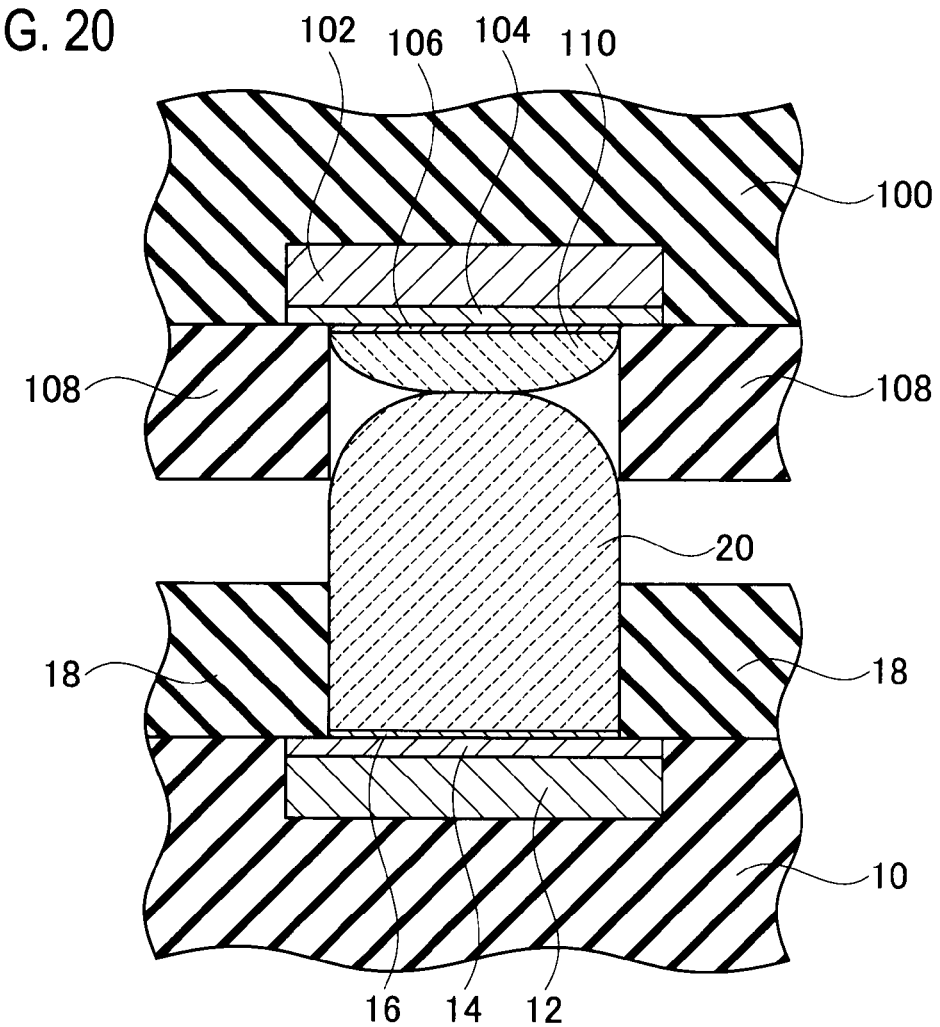
FIG. 20 is a schematic cross sectional view showing another example of connection between the structure according to the embodiment of the present invention and the mounting substrate.

In the structures shown in FIGS. 18 and 20, since the CNT bundles 20 and 110 contact each other, it is possible to connect the CNT bundles 20 and 110 without generating a contact potential difference and the like. Moreover, since a stroke length capable of maintaining contact of the CNT bundles 20 and 110 increases, it is possible to uniformly contact while ensuring the pressure even when heights of the leading ends of the CNT bundles 20 and 110 vary.

(First Application)

Figure 21:
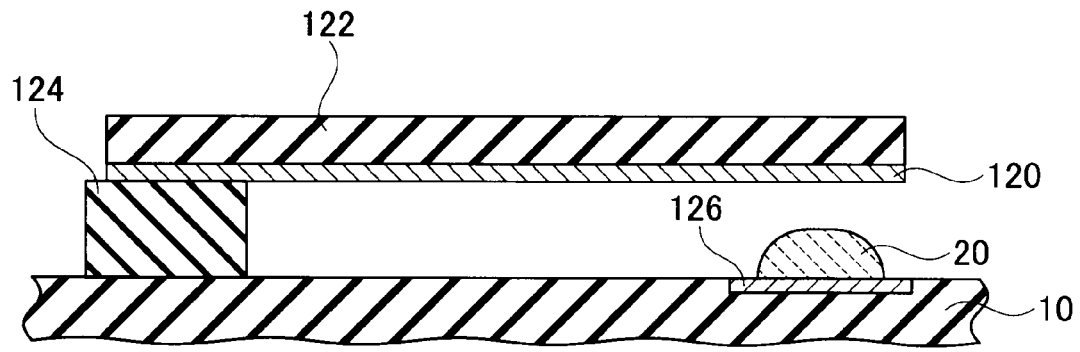
FIG. 21 is a schematic cross sectional view showing an example of a MEMS device using a structure according to a first application of the embodiment of the present invention.

As a first application of the embodiment of the present invention, a micro-electromechanical system (MEMS) device, such as a micro switch, using a CNT bundle will be described. As shown in FIG. 21, the MEMS device according to the first application includes a CNT bundle 20 as a fixed electrode and a movable beam 122. The CNT bundle 20 is disposed on a wiring 126 provided in the underlying layer 10 on a substrate. The movable beam 122 is fixed on the underlying layer 10 by using an anchor 124. A leading end of the movable beam 122 separated from the underlying layer 10 faces the CNT bundle 20. A movable electrode 120 is provided on a surface of the movable beam 122 which faces the underlying layer 10.

It is possible to bend and displace the movable beam 122 so as to contact the CNT bundle 20 by driving the movable beam 122 with an electrostatic force, a heat stress, an electromagnetic force, a piezoelectric force or the like. It is possible to achieve a contact structure that enables stable and sufficient contact by using the CNT bundle 20 having high electric conductivity and high thermal conductivity.

(Second Application)

Figure 22:
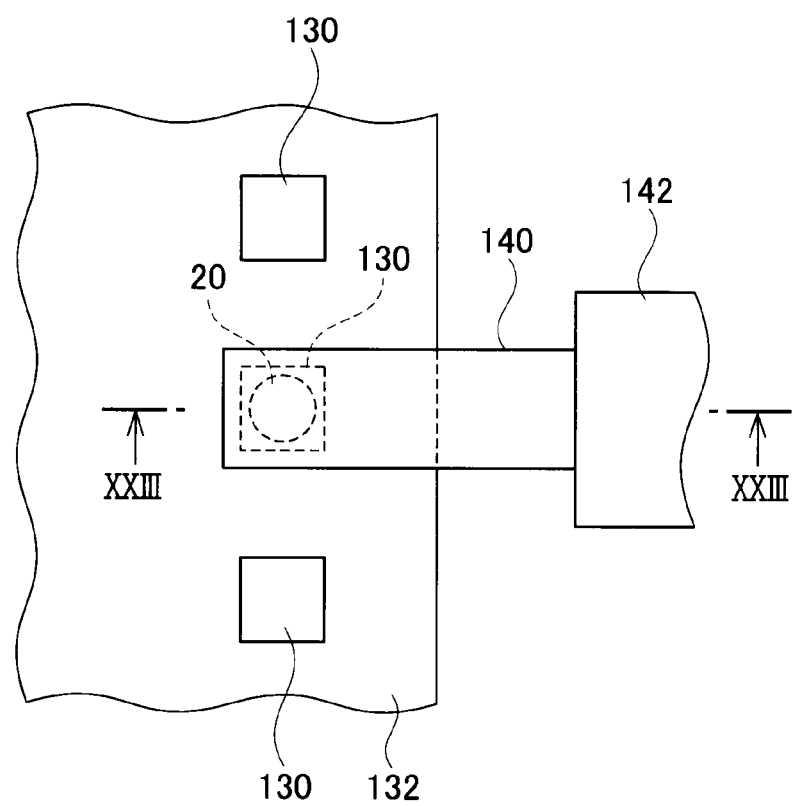
FIG. 22 is a schematic cross sectional view showing an example of a probe using a structure according to a second application of the embodiment of the present invention.
Figure 23:
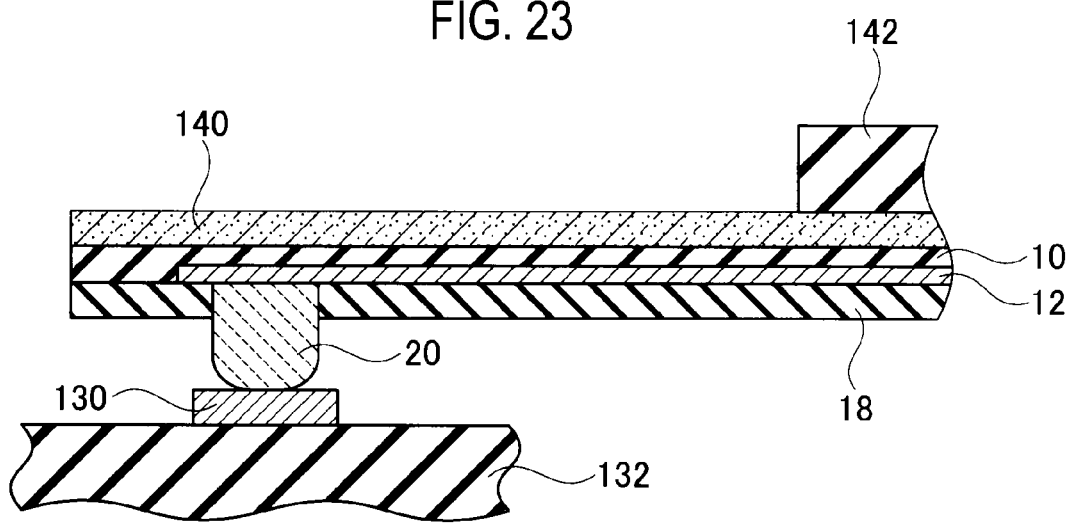
FIG. 23 is a cross sectional view taken along line XXIII-XXIII of the probe shown in FIG. 22.

In a second application of the embodiment of the present invention, a probe of a prober used for inspection of electrical characteristics of an electronic device using a CNT bundle will be described. As shown in FIGS. 22 and 23, a probe according to the second application includes a wiring (a conductive film) 12 provided on a lead beam 140, such as silicon (Si) and the like, and a CNT bundle 20 provided on the wiring 12. The wiring 12 is formed in an underlying layer 10 on the lead beam 140. A base end of the CNT bundle 20 is buried in an insulating film 18 provided on a surface of the underlying layer 10 in a leading end portion of the lead beam 140. The lead beam 140 is attached to a probe head 142 of the prober.

For example, it is possible to execute an operation test of a semiconductor chip 132 by contacting the CNT bundle 20 with a pad 130 provided on a surface of the semiconductor chip 132. It is possible to stably contact the probe with the pad 130 by an elastic effect of the CNT bundle 20, and thereby to improve reliability of test data.

Figure 24:
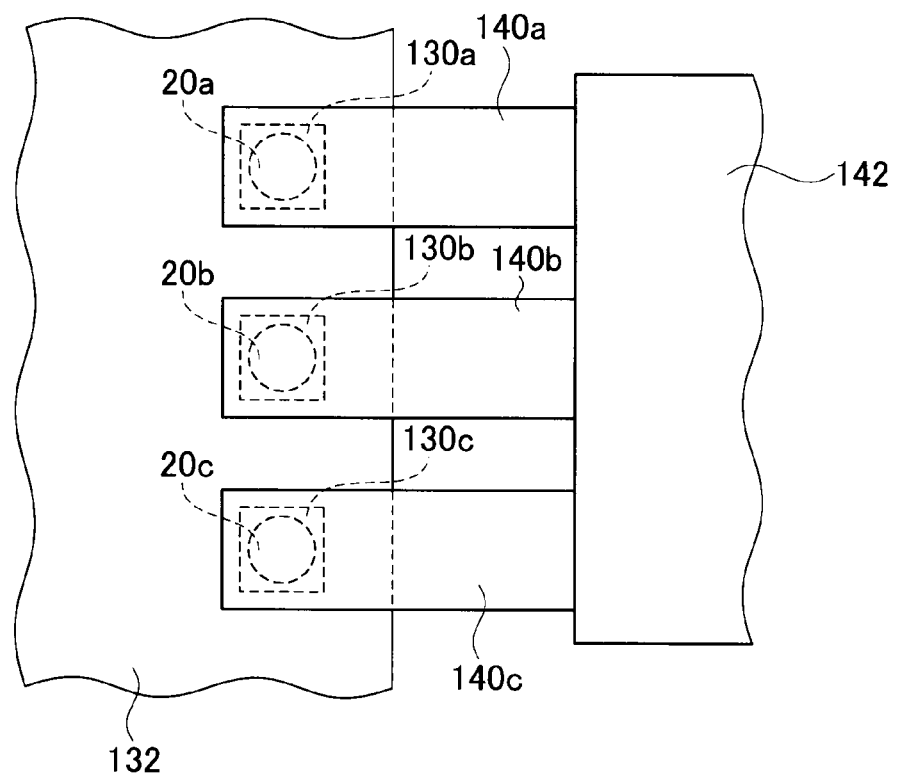
FIG. 24 is a schematic cross sectional view showing another example of a probe using the structure according to the second application of the embodiment of the present invention.

Further, a probe array may be provided by using a plurality of lead beams. For example, as shown in FIG. 24, CNT bundles 20a, 20b, 20c are provided on leading ends of a plurality of lead beams 140a, 140b, 140c, respectively. An operation test is executed by contacting the respective CNT bundles 20a, 20b, 20c with a plurality of pads 130a, 130b, 130c on a semiconductor chip 132. It is possible to stably contact with the pads 130a, 130b, 130c at the same time by an elastic effect of each of the CNT bundles 20a, 20b, and 20c.

Figure 25:
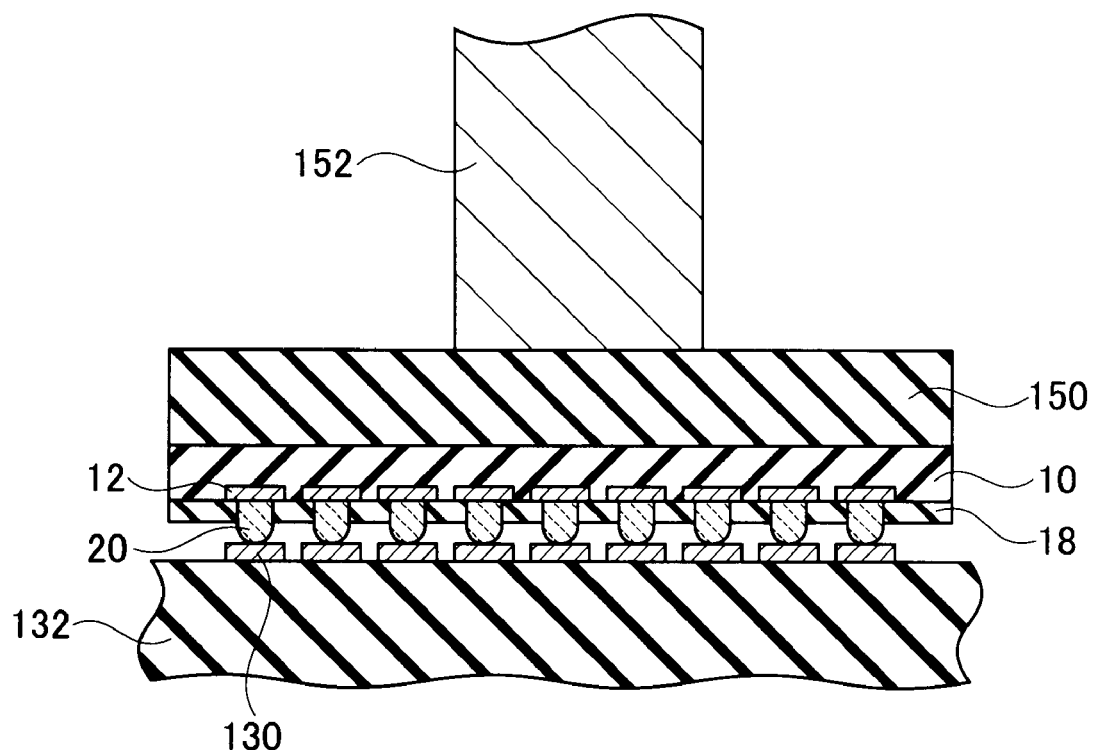
FIG. 25 is a schematic cross sectional view showing another example of a probe using the structure according to the second application of the embodiment of the present invention.

Furthermore, as shown in FIG. 25, an array of a plurality of CNT bundles 20 may be disposed as bumps on a substrate 150 provided at a leading end of a probe pin 152. Each of the CNT bundles 20 is disposed on a plurality of wirings 12 formed in an underlying layer 10 on the substrate 150. Moreover, each of the CNT bundles 20 is buried in an insulating film 18 provided on the underlying layer 10. Each of the CNT bundles 20 has elasticity. Thus, it is possible to stably contact with the pads 130 on the semiconductor chip 132 at the same time.

Other Embodiments

The present invention has been described as mentioned above. However the descriptions and drawings that constitute a portion of this disclosure should not be perceived as limiting this invention. Various alternative embodiments and operational techniques will become clear to persons skilled in the art from this disclosure.

In the embodiment of the present invention, the structure including the CNT bundle is used as the contact electrode of the semiconductor device. However, it should be easily understood from the foregoing descriptions that the present invention is not limited to the semiconductor device, and may be applied to an electronic device, such as a liquid crystal display, a magnetic recording device, an optical recording device, a thin film magnetic head, a superconductor device, an acoustoelectric conversion device, and the like.

Various modifications will become possible for those skilled in the art after storing the teachings of the present disclosure without departing from the scope thereof.

The invention claimed is:

1. A structure comprising:
    a conductive film provided in an underlying layer; and
    a carbon nanotube bundle including a plurality of carbon nanotubes each having one end connected to the conductive film,
    wherein, at other end side of the carbon nanotube bundle, at least carbon nanotubes allocated at an outer side of the carbon nanotube bundle extend with convex curvatures toward the outside of the carbon nanotube bundle, and the convex curvatures of the carbon nanotubes allocated at the outer side of the carbon nanotube bundle are larger than those of an inner side of the carbon nanotube bundle, and diameters of the carbon nanotube bundle decrease toward the other end side of the carbon nanotube bundle.

2. The structure of claim 1, wherein lengths of the carbon nanotubes at the other end side increase from the inner side toward the outer side of the carbon nanotube bundle.

3. The structure of claim 1, wherein each of the carbon nanotubes has a meandering shape at the one end side.

4. The structure of claim 1, further comprising a metal film connected to the other end side.

5. The structure of claim 1, wherein the carbon nanotube bundle is disposed in a through hole cut in an insulating film on the underlying layer.

6. An electronic device comprising:
    a first substrate including a contact electrode of a first carbon nanotube bundle including a plurality of first carbon nanotubes each having one end connected to first wiring provided on a underlying layer, wherein, at other end side of the first carbon nanotube bundle, at least first carbon nanotubes allocated at an outer side of the first carbon nanotube bundle extend with convex curvatures toward the outside of the first carbon nanotube bundle, the convex curvatures of the first carbon nanotubes allocated at the outer side of the first carbon nanotube bundle are larger than those of an inner side of the first carbon nanotube bundle, and diameters of the first carbon nanotube bundle decrease toward the other end side of the first carbon nanotube bundle; and
    a second substrate facing the first substrate, the second substrate including second wiring electrically connected to the contact electrode.

7. The electronic device of claim 6, wherein an insulating film including a through hole fitted at least to a portion of the other end side of the first carbon nanotube bundle is provided on the second substrate.

8. The electronic device of claim 6, wherein the second substrate includes a second carbon nanotube bundle including a plurality of second carbon nanotubes each having one end connected to the second wiring, the contact electrode is connected to other end of the second carbon nanotube bundle, and, at the other end of the second carbon nanotube bundle, at least second carbon nanotubes allocated at an outer side of the second carbon nanotube bundle extend with convex curvatures toward the outside of the second carbon nanotube bundle, the convex curvatures of the second carbon nanotubes allocated at the outer side of the second carbon nanotube bundle are larger than those of an inner side of the second carbon nanotube bundle, and diameters of the second carbon nanotube bundle decrease toward the other end of the second carbon nanotube bundle.

9. A method for fabricating a structure by growing a carbon nanotube bundle in a reaction chamber generating a plasma, the carbon nanotube bundle including a plurality of carbon nanotubes each having one end connected to a conductive film provided on an underlying layer, the method comprising:
    growing a first portion of the carbon nanotubes on the conductive film by setting a growth temperature, concentration of a hydrocarbon gas supplied to the reaction chamber, and grid potential of a grid provided between the plasma and the conductive film so that, at other end side of the carbon nanotube bundle, at least carbon nanotubes allocated at an outer side of the carbon nanotube bundle extend with convex curvatures to the outside of the carbon nanotube bundle, the convex curvatures of the carbon nanotubes allocated at the outer side of the carbon nanotube bundle are larger than those of an inner side of the carbon nanotube bundle, and diameters of the carbon nanotube bundle decrease toward the other end side of the carbon nanotube bundle; and
    growing a second portion of the carbon nanotubes by executing at least any one of lowering the growth temperature, increasing the concentration of the hydrocarbon gas, and reducing the grid potential so that each of the carbon nanotubes has a meandering shape between the conductive film and the first portion.

* * * * *